United States Patent
Kocak et al.

(10) Patent No.: US 9,816,856 B2
(45) Date of Patent: Nov. 14, 2017

(54) MAGNETICALLY COUPLED OPTICAL CONNECTOR ASSEMBLY AND RELATED METHODS

(71) Applicant: HARRIS CORPORATION, Melbourne, FL (US)

(72) Inventors: Donna M. Kocak, Indialantic, FL (US); Peter A. Wasilousky, Indialantic, FL (US); William R. Palmer, Melbourne, FL (US); Timothy F. McLellan, Viera, FL (US); Mark E. Blue, Palm Bay, FL (US); Lee Martin Burberry, West Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 175 days.

(21) Appl. No.: 14/972,395

(22) Filed: Dec. 17, 2015

(65) Prior Publication Data

US 2017/0176245 A1 Jun. 22, 2017

(51) Int. Cl.
*H01J 40/14* (2006.01)
*G01J 1/02* (2006.01)
(Continued)

(52) U.S. Cl.
CPC .......... *G01J 1/0266* (2013.01); *G01J 1/0271* (2013.01); *G01J 1/0403* (2013.01); *H01S 5/022* (2013.01)

(58) Field of Classification Search
CPC .... G01J 1/0266; G01J 1/0271; G02B 6/3816; G02B 6/3886
(Continued)

(56) References Cited

U.S. PATENT DOCUMENTS 4,599,745 A 7/1986 Baran et al.
4,682,848 A 7/1987 Cairns et al.
(Continued)

FOREIGN PATENT DOCUMENTS

EP 2 759 848 7/2014
WO 02/31565 4/2002
WO 2013032954 3/2013

OTHER PUBLICATIONS

Asakawa et al. "Underwater Optical Connector for Remotely Operated Submersibles" Electronics Letters; vol. 20 No. 25/26; Dec. 6, 1984, pp. 2.
(Continued)

*Primary Examiner* — Kevin Pyo
(74) *Attorney, Agent, or Firm* — Allen, Dyer, Doppelt, Gilchrist, P.A.

(57) ABSTRACT

An optical connector assembly may include a first housing having a first opening therein, a second housing having a second opening therein, a first optical window carried by the first housing within the first opening, a second optical window carried by the second housing within the second opening, at least one Vertical Cavity Surface Emitting Laser (VCSEL) carried within the first housing behind the first optical window, and at least one photodetector carried within the second housing behind the second optical window. A first magnetic member may be carried by the first housing, and a second magnetic member may be carried by the second housing and configured to cooperate with the first magnetic member to bias the first and second housings together so that the at least one VCSEL and the at least one photodetector are in optical alignment.

24 Claims, 9 Drawing Sheets

(51) Int. Cl.
*G01J 1/04* (2006.01)
*H01S 5/022* (2006.01)

(58) Field of Classification Search
USPC .............................. 250/216, 239; 385/53, 57
See application file for complete search history.

(56) References Cited

U.S. PATENT DOCUMENTS

| | | | |
|---|---|---|---|
| 5,267,070 | A | 11/1993 | Stewart et al. |
| 5,377,165 | A | 12/1994 | LaPointe et al. |
| 5,940,564 | A | 8/1999 | Jewell |
| 6,332,787 | B1 | 12/2001 | Barlow et al. |
| 6,464,405 | B2 | 10/2002 | Cairns et al. |
| 6,813,218 | B1 | 11/2004 | Antonelli et al. |
| 6,821,027 | B2 | 11/2004 | Lee et al. |
| 7,628,543 | B2 | 12/2009 | Coronado |
| 7,749,008 | B2 | 7/2010 | Klassen et al. |
| 7,949,024 | B2 | 5/2011 | Joseph |
| 7,953,326 | B2 | 5/2011 | Farr et al. |
| 8,200,094 | B1 | 6/2012 | Zhovnirovsky et al. |
| 8,388,235 | B1 | 3/2013 | Volker et al. |
| 8,682,244 | B2 | 3/2014 | Rhodes et al. |
| 8,716,902 | B2 | 5/2014 | Rhodes et al. |
| 9,236,942 | B1 | 1/2016 | Roberds et al. |
| 2002/0076172 | A1* | 6/2002 | Meyer ................... G02B 6/421 385/91 |
| 2008/0226224 | A1 | 9/2008 | Blauvelt et al. |
| 2015/0055914 | A1 | 2/2015 | Dell'Anno et al. |

OTHER PUBLICATIONS

Stephens et al. "Development and testing of the HydraStar underwater mateable, fiber-optic, electric (hybrid) connector" 2000 Offshore Technology Conference; Houston, TX, May 1-4 2000; pp. 7.
Lamare et al. "Underwater mateable electro-optical connectors: The feedback from Antares" Slsevier Science; 2008, pp. 4.
"Product Data Sheet—Hydrastar", Apr. 8, 2002; pp. 4; www.seaconbrantner.com.
Granger et al. "Non-contact wet mateable connectors for power and data transmission," Battelle Memorial Institute, Oceans'13, http://www.mtsjournal.org/Papers/PDFs/130503-104.pdf;2013, pp. 4.
Tomasz Ciamulski "Microwave Technology for pinless connectors," WiSub, OI'14, http://www.oceanologyinternational.com/_novadocuments/50487?v=635320289548030000; Oceanology International Mar. 11-Mar. 13, 2014; pp. 18.
Seatooth Connect, WFS Technologies, http://www.wfs-tech.com/index.php/products/wireless-power, pp. 2, Retrieved from internet Dec. 4, 2015.
"Discover cost savings with Seatooth archive" http://www.wfs-tech.com/subsea-wireless-instrumentation/seatooth; pp. 6. Retrieved from internet Dec. 7, 2015.
http://en.wikipedia.org/wiki/Resonant_inductive_coupling#Energy_transfer_and_efficiency. pp. 9; Retrieved from internet Dec. 11, 2015.
http://www.mesasystemsco.com/pdf/Inductive_Power_transfer_data_coupling_products_overview.pdf; pp. 10. Retrieved from internet Dec. 4, 2015.
Adeeb et al. "An inductive link-based wireless power transfer system for biomedical applications" http://www.hindawi.com/journals/apec/2012/879294; Active and Passive Electronic Components vol. 2012, article ID 879294; Abstract Only.
http://www.conductix.us/sites/default/files/downloads/Brochure_-_Inductive_Power_Transfer_-_IPT.pdf; pp. 16, Retrieved from internet Dec. 4, 2015.
http://www.conductix.us/en/products/inductive-power-transfer-iptr/inductive-power-transfer-iptr-charge?parent_id=5798; pp. 3, Retrieved from internet Dec. 4, 2015. pp. 3, Retrieved from internet Dec. 4, 2015.
http://www.mesasystemsco.com; 1 pg. Retrieved from internet Dec. 4, 2015.

* cited by examiner

MAGNETICALLY COUPLED OPTICAL CONNECTOR ASSEMBLY AND RELATED METHODS

TECHNICAL FIELD

The present invention relates to communications devices, and more particularly to optical couplers for communications systems and related methods.

BACKGROUND

Optical connectors are often used in a variety of harsh environments where communication or power interfaces need to be coupled together. For example, such environments may include subsea, outer space, remote or hard to reach locations, and hazardous environments. In undersea environments, remotely operated underwater vehicles (ROVs) may need to plug into subsea vessels or devices to communicate therewith, and may have mechanical manipulators to mate signal and/or power connectors together. Yet, successfully mating of these connectors often requires specialized tooling and highly skilled operators. Even so, the manipulators may exert a significant amount of force on the connectors and thus they are susceptible to relatively frequent damage. Moreover, debris between the connectors may also lead to damage and/or reliability issues, particularly in view of the stringent alignment factors typically associated with such connectors.

Furthermore, the operating environment for such connectors may be extremely harsh. Referring again to subsea applications, not only do such applications involve operation in corrosive salt water, but at depth the pressures on such connectors may be very high. In addition, in the case of optical fiber communications, it may be difficult to align optical fibers for communication even in ideal circumstances, but in subsea or other environments such as those listed above, this may be particularly challenging.

One example of wet matable connector is disclosed in U.S. Pat. No. 6,464,405 to Cairns et al. This reference discloses an underwater connector which has a plug and a receptacle unit each having an internal chamber in which a respective contact module is located. Each module has an end face having contacts for engagement with corresponding contacts on the other module when the units are releasably mated together. Each chamber has a resilient forward end with an opening communicating with the respective chamber, and an actuator in each unit compresses the forward end to seal the opening when the units are unmated. As the units are mated, the actuator in one unit is urged rearwardly and the forward end of the chamber in the other unit is urged rearwardly, such that each end opens to permit the module of one unit to pass into the chamber of the other unit, and into engagement with the other module so that all contacts are engaged for communication between the units.

Despite the existence of such connector configurations, further enhancements in couplers for communications systems, such as in subsea, outer space, and hazardous environments, may be desired in certain applications.

SUMMARY

An optical connector assembly may include a first housing having a first opening therein, a second housing having a second opening therein, a first optical window carried by the first housing within the first opening, a second optical window carried by the second housing within the second opening, at least one Vertical Cavity Surface Emitting Laser (VCSEL) carried within the first housing behind the first optical window, and at least one photodetector carried within the second housing behind the second optical window. A first magnetic member may be carried by the first housing, and a second magnetic member may be carried by the second housing and configured to cooperate with the first magnetic member to bias the first and second housings together so that the at least one VCSEL and the at least one photodetector are in optical alignment.

More particularly, at least one of the first and second magnetic members may comprise at least one electromagnet. Moreover, the optical connector assembly may further include a controller coupled to the at least one electromagnet and configured to operate the at least one electromagnet to create relative rotational movement between the first and second housings. The controller may also be configured to operate the at least one electromagnet to create an attractive force with respect to the other magnetic member for coupling the first and second housings together, and/or to operate the at least one electromagnet to create a repulsive force with respect to the other magnetic member for decoupling the first and second housings from one another.

The first housing and the first optical window may define a first hermetically sealed chamber for the at least one VCSEL, and the second housing and the second optical window may define a second hermetically sealed chamber for the at least one photodetector. Furthermore, the optical connector assembly may further include respective first and second self-aligning features carried by the first and second housings configured to align the first and second optical housings. The first and second housings may each include respective clamp features configured to mechanically hold or secure the first and second housings together.

In addition, the first and second housings may each have at least one respective fluid exit port for fluid evacuation when the first and second optical windows come in physical contact with one another. The first and second magnetic members may each include a respective array of magnets positioned adjacent the first and second optical windows. Additionally, the optical connector assembly may further include a controller coupled with the transmit laser element and configured to beam steer light output from the at least one VCSEL (in some embodiments, a plurality of these optical paths may be incorporated adjacent to one another for redundancy or increased signal capacity). The optical connector assembly may also include a respective inductive power winding carried by each of the first and second housings and configured to inductively transfer power therebetween, and further contained in a completely sealed or hermetically sealed respective housing.

A related method may include positioning first and second optical connectors, such as those described briefly above, adjacent one another. The method may further include operating at least one electromagnet from among the first and/or second magnetic members to create relative rotational movement between the first and second housings.

DETAILED DESCRIPTION OF THE EMBODIMENTS

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation is used to indicate similar element in different embodiments.

Figure 1:
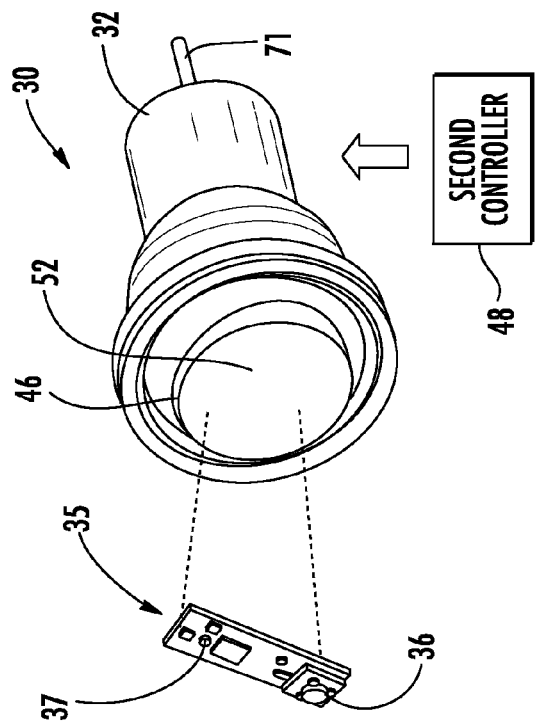
FIG. 1 is a perspective view of an optical connector assembly in accordance with an example embodiment.
Figure 2:
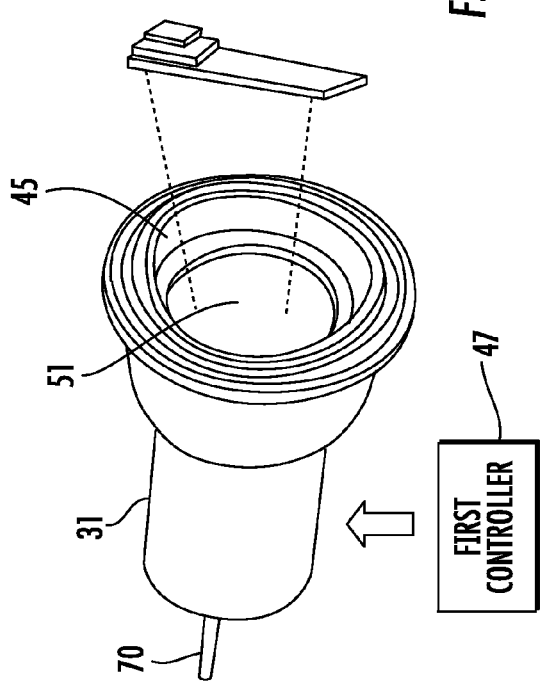
FIG. 2 is an exploded view of the optical connector assembly of FIG. 1.
Figure 3:
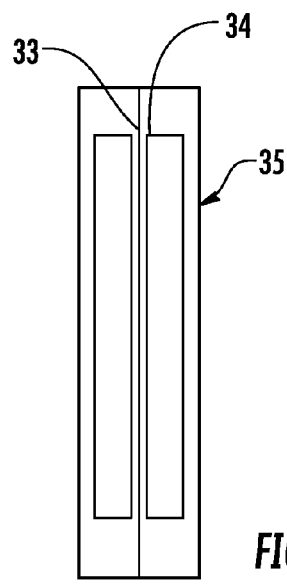
FIG. 3 is a cross-sectional view of the optical connectors of the assembly of FIG. 1 in a mated positioned illustrating contact between the optical windows thereof.

Referring initially to FIGS. 1-3, an optical connector assembly 30 is provided which is particularly well suited for harsh environments (although it may be used in "non-harsh" environments as well). As noted above, such environments may include subsea applications, such as between a bulkhead of a vessel and an ROV or submarine. In outer space, such connections may be between spacecrafts, satellites, and/or space stations, for example. Other harsh environments may include underground applications, such as in hydrocarbon wells or mining applications, etc. However, these are just a few examples of applications where the optical connector assembly 30 may be beneficial, and further applications will be appreciated by those skilled in the art.

In particular, the optical connector assembly 30 illustratively includes a first housing 31 having a first opening therein, a second housing 32 having a second opening therein, a first optical window 33 carried by the first housing within the first opening, and a second optical window 34 carried by the second housing within the second opening. Furthermore, in the present example, each of the first and second housings 31, 32 illustratively includes a plurality of optical transceivers 35 carried within the first and second housings behind the first and second optical windows 33, 34. In the present example, each of the optical transceivers 35 includes a Vertical Cavity Surface Emitting Laser (VCSEL) array 36 and a photodetector array 37, although in some embodiments different optical transmitter configurations may be used. By way of example, the optical windows 33, 34 may be a transparent glass, acrylic glass, or other suitable material that allows light to pass for optical signal communication. Additional discrete optics such as integral lenses may be incorporated within the glass itself. Moreover, respective mechanical supports 51, 52 may be carried by the first and second housings 31, 32 to support the optical windows 33, 34. An example optical transceiver 35 having an expanded optical path including VCSEL and photodetector arrays which may be used is disclosed in U.S. Pat. No. 7,949,024 to Joseph (which is hereby incorporated herein in its entirety by reference), although other suitable optical devices may also be used in various embodiments. As seen in FIG. 1, a respective optical fiber cable 70, 71 feeds into the back side of each of the first and second housings 31, 32.

Figure 4:
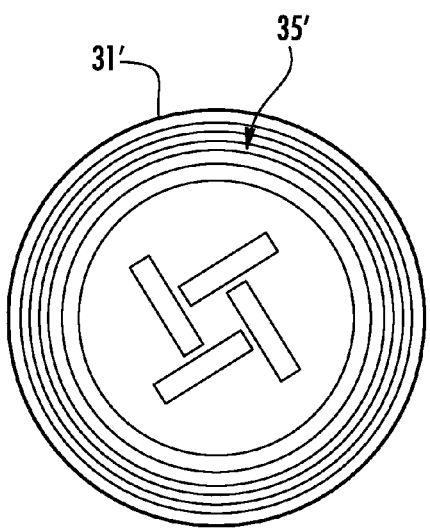
FIGS. 4-6 are end views of connectors which may be used with the assembly of FIG. 1 and each having different VCSEL configurations.
Figure 5:
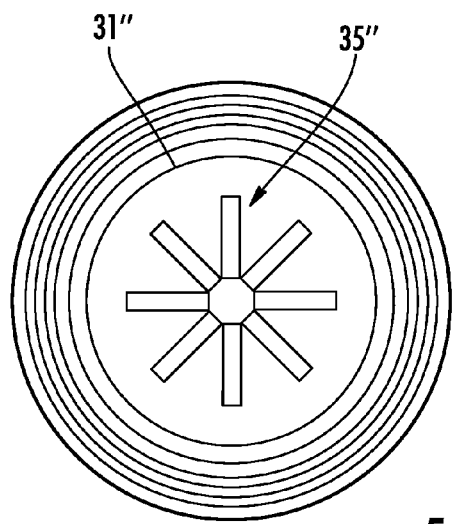
Figure 6:
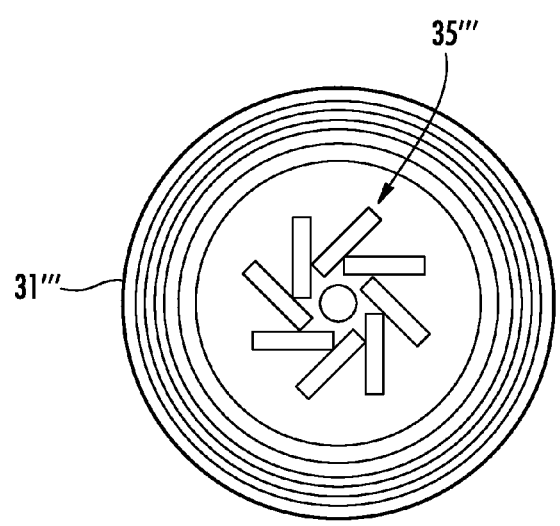

More particularly, there is a pair of optical transceivers 35, one in each of the first and second housings 31, 32 in the illustrated example, which are positioned so that when the optical windows 33, 34 come into contact with one another (see FIG. 3), the VCSEL arrays 36 of the first housing are optically aligned with the photodetector arrays 37 of the second housing, and vice-versa. Other example configurations of transceivers 35 are shown in FIGS. 4-6. In the housing 31', there is an array of four optical transceivers 35'. In the housing 31", there is an array of eight optical transceivers 35" arranged in a radial pattern, and in the housing 31'" there are eight optical transceivers 35'" arranged in a pattern generally resembling a phyllotaxis spiral. Here again, other numbers of optical transceivers and arrangements thereof may be used in different embodiments. Moreover, in some embodiments, optical transmitters and receivers need not be included in the same housing, e.g., the first housing 31 may include one or more VCSEL arrays 36, and the second housing 32 may include one or more photodetectors 37 for one-way communication. A respective seal ring 41, 42 may optionally be carried by each of the first and second housings 31, 32 (FIG. 2) to help seal out fluids or contaminants, if desired.

In the illustrated example, the first housing 31 further illustratively includes an array of magnets 39, and the second housing 32 includes an array of magnets 40. It should be noted that various magnet shapes may be used in different embodiments, e.g., squared or rectangular, rounded, etc. The magnets 39 are radially spaced around the optical window 33, and the magnets 40 are radially spaced around the optical window 34 (FIG. 2). In the present example, there are four magnets 39 and four magnets 40, although different numbers of magnets may be used in different embodiments. The magnets 39, 40 may be permanent magnets in some embodiments, of electromagnets may be used. In addition, a combination of permanent and electromagnets may be used in some embodiments (e.g., the magnets 39 may be electromagnets and the magnets 40 be permanent magnets, or vice-versa). Permanent magnets and electromagnets may also be used together in the same housing in some applications. Generally speaking, the magnets 39, 40 cooperate to bias the optical transceivers 35 into optical alignment, as noted above. Operation of the magnets 39, 40 will be discussed further below.

Figure 7:
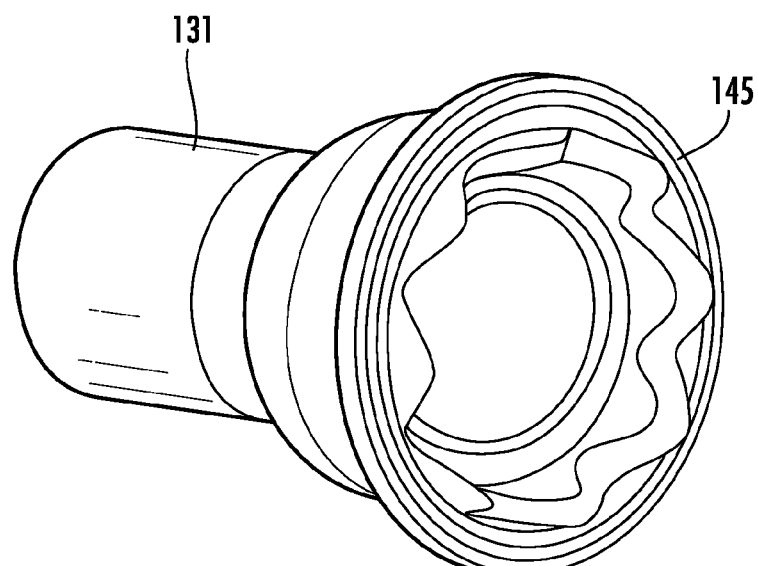
FIG. 7 is a perspective view of an example optical connector which may be used with the assembly of FIG. 1 having self-aligning features thereon.
Figure 8:
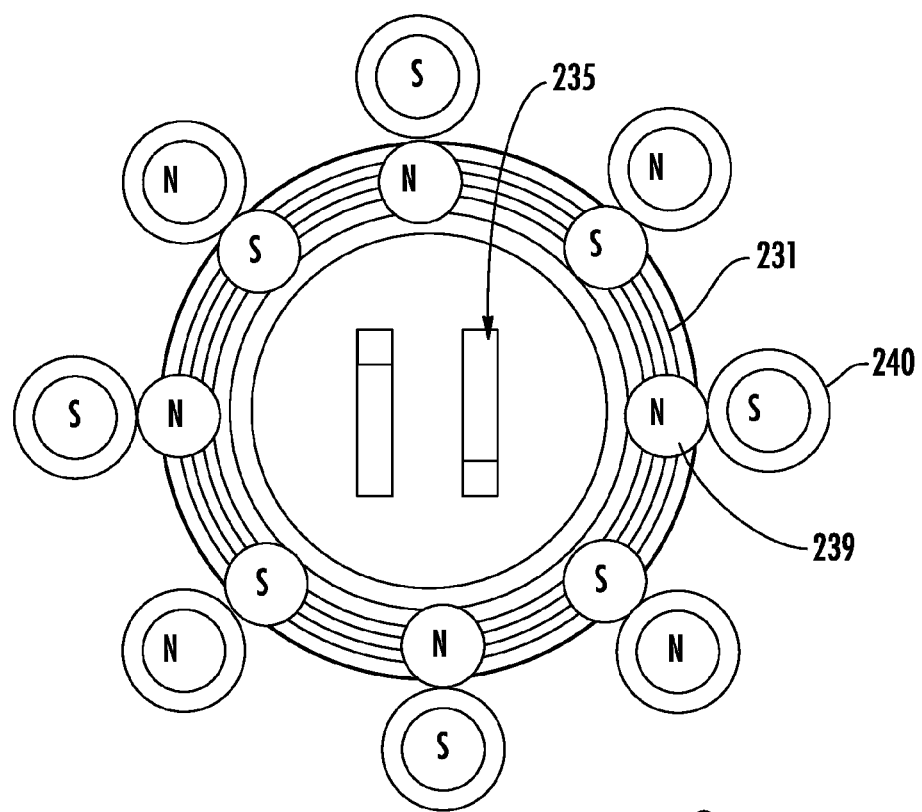
FIG. 8 is an end view of a connector which may be used with the system of FIG. 1 including an array of magnets and/or electromagnets.

The first housing 31 and the first optical window 33 may define a first hermetically sealed chamber for the optical transceiver(s) 35 therein, and the second housing 32 and the second optical window 34 may similarly define a second hermetically sealed chamber for the optical transmitter(s) (see FIG. 3). In this regard, a respective sealing ring (not shown) may be positioned between the optical windows 33, 34 and their respective first and second housings 31, 32. The first and second housings 31, 32 also illustratively include respective first and second self-aligning features 45, 46 which are configured to align the first and second optical housings as then come into contact with one another. In the illustrated example, the self-aligning features 45, 46 are concentric rims, one of which fits within the other and which also are angled or ramped so that contact therebetween causes them to slidably engage and twist into proper alignment for the optical transceivers 35. Another example embodiment of a housing 131 with self-aligning features 145 is shown in FIG. 7. Here, the self-aligning features 145 resemble serrations or teeth in the rim and provide "clocking angles" to align the VCSELs 36 with the photodetectors 37 as the first and second housings are mated together. Other suitable self-aligning features may also be used in different embodiments.

Referring additionally to FIGS. 8-11, operation of the above-noted magnets for alignment and/or coupling of the first and second housings will now be further described. In the example of FIG. 1, respective first and second controllers 47, 48 may be carried by the vehicle or device to which the first and second housings 31, 32 are attached. By way of example, the first and second controllers 47, 48 may be implemented using a combination of hardware (e.g., processor, etc.) and a non-transitory computer-readable medium having computer-executable instructions for causing the processor to perform the various operations described herein. The associated circuits may be located in the connector housings 31, 32, or in certain use cases portions of the control circuitry may be located external to the connector itself.

Generally speaking, the first and second controllers 47, 48 may be used to implement a feedback loop between the transceivers 36 and the photodiodes 37. More specifically, the transceiver 36 (light emitter) provides multiple light paths that are spread across the junction. The light paths are selectable and or directable (similar in some respects to a phased array). More particularly, the transmit side may provide multiple light path choices that are controllable. Through the feedback loop, the control circuitry may search using applicable selection parameters through the light path options available, each time receiving feedback from the photodiode 37. This may be accomplished with Receive Signal Strength Indicator (RSSI) feedback, which may be provided by a sensor associated with the photodiode (not shown). The RSSI sensor sends the signal strength levels back to the transmitter 36 relative to the light paths used in the searcher routine. When the best configuration of light transmission is recognized (identified) by the control loop, that is the optimal configuration which is selected for use. Notably, every time the connector housings 31, 32 are mated and de-mated, the configuration (light path chosen) may change dependent on a variety of factors, including contaminants, alignment or other variables associated with the connector junction itself.

In the illustrated examples, both permanent magnets and electromagnets are used for connection of the first and second housings 31, 32. More particularly, the permanent magnets (and optionally the electromagnets) may be used to help enable or facilitate connection (attraction) between the first and second housings 31, 32. Moreover, the electromagnets and associated control circuitry may also be used to enable or facilitate disconnects (repulsion), as well as the ability of the first and second housings 31, 32 to rotate relative to one another or "wiggle", as will be described further below. Beginning at Block 101 of the flow diagram 100, with respect to operation of the electromagnets, the controllers 47, 48 may cooperate to cause the electromagnets to initially create an attractive force for drawing the first and second housings 31, 32 together as the first and second housing are positioned near one another so that the self-aligning features 45, 46 engage each other to couple or mate the first and second optical windows 33, 34 and place the optical transceivers 35 into optical alignment, at Blocks 102-103.

Figure 9:
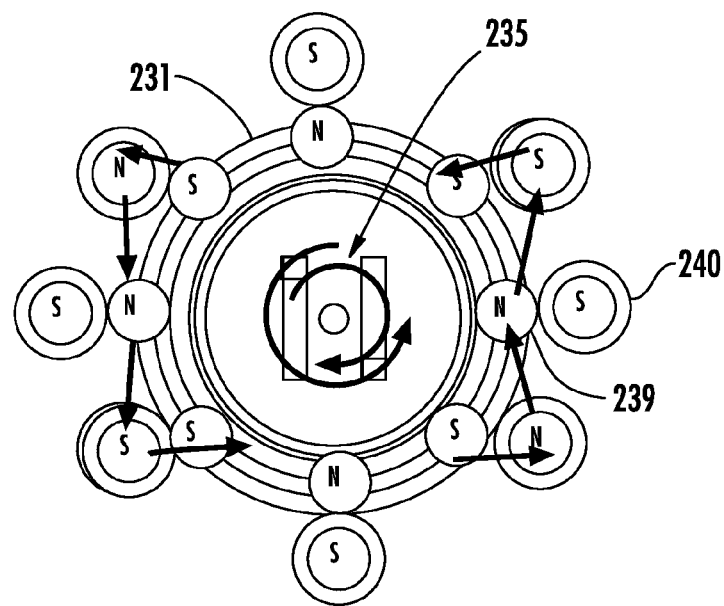
FIG. 9 is an end view of the connector of FIG. 8 illustrating operation of the electromagnets to rotate the optical connectors with respect to one another.

In some embodiments, once the first and second optical windows 33, 34 come into contact with one another, an active magnetic bias operation may be performed to enable proper cleaning and seating of the first and second optical windows to one another. In the example illustrated in FIGS. 8 and 9, a first housing 231 (which illustratively includes two optical transmitters 235) includes an array of eight magnets 239 (which may be permanent and/or electromagnets) which have north (N) or south (S) polarities, as shown. The corresponding electromagnets 240 of a second housing (not shown in FIGS. 8 and 9) may be operated to have opposite polarities to the electromagnets 239 to create an attractive force for drawing the housings together, as noted above. As the optical windows come in contact, the magnetic fields of the electromagnets 239, 240 may be selectively operated to cause one or both of the optical windows to pivot or rotate with respect to one another, as seen in FIG. 9 and indicated by the circular arrows (Block 104).

More particularly, this approach may incorporate a balanced magnet bias that enables the housing 231 to seat itself by providing a rotation induced by switching the polarity of the electromagnets 239, 240. This may conceptually be considered as a "wiggle feature" that may be used to autonomously wipe the window-on-window interface clean. This feature may effectively enable the ability to self-clean and reset the interface remotely. By way of example, the mounted position of certain electromagnets 239, 240 may be selective adjusted to leave a balanced magnet field when the electromagnets are un-energized even while remaining physically misaligned in the mounted configuration of the connector. Then, switching the polarity of the electromagnets as shown in FIG. 9 will cause a rotational shift in the magnetically adjoined connector half, and switching polarity rapidly will cause rapid back and forth rotations, effectively "wiggling" the housing 231 to help seat the optical windows on one another and remove fluid or contaminants from between them. It should also be noted that the first and second housings 31, 32 may in some embodiments be tilted (or rocked back and forth), in addition to the relative rotation, by invoking a different charge routine within the electromagnet control function.

Figure 10:
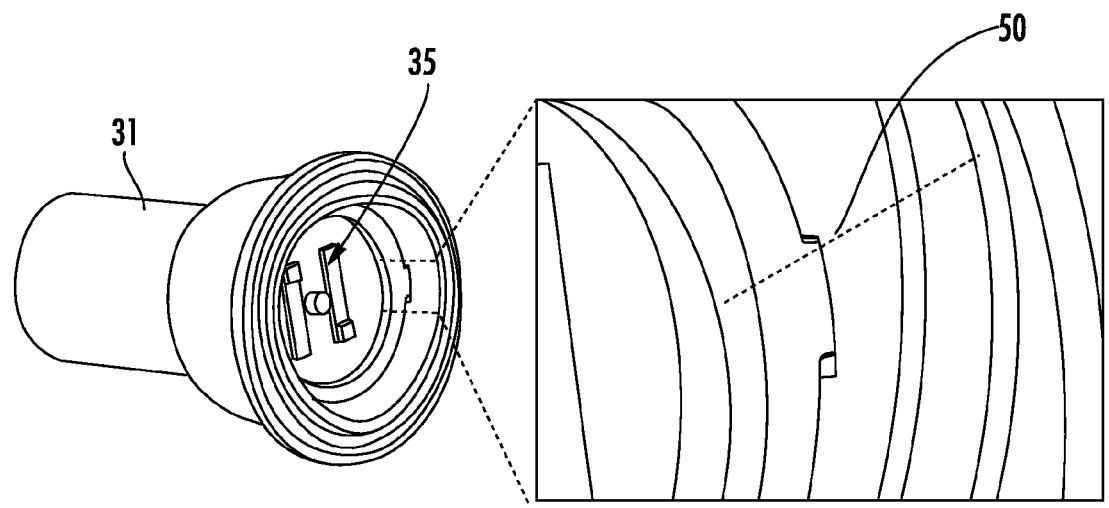
FIG. 10 is a perspective view of an example optical connector which may be used with the assembly of FIG. 1 having a fluid exit port.
Figure 11:
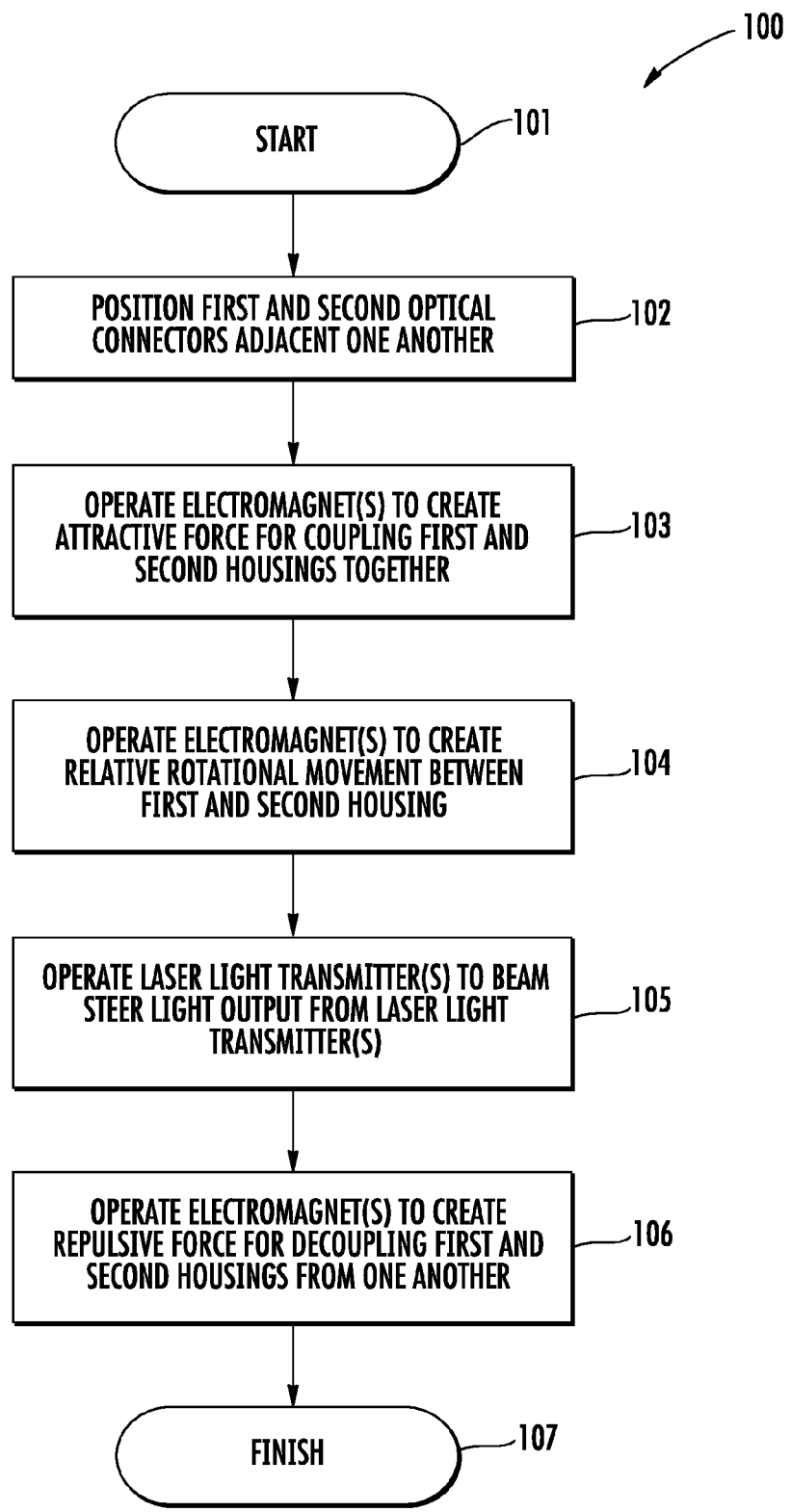
FIG. 11 is a flow diagram illustrating method aspects associated with mating of optical connectors.

In this regard, the first and/or second connectors 31, 32 may further have one or more respective fluid exit ports 50 for fluid evacuation when the first and second optical windows come in physical contact with one another, as shown in the exploded portion of FIG. 10. The ports 50 may thereby allow fluid, contaminants, etc., to be evacuated from between the optical windows 33, 34 as they are pressed into physical contact and optionally rotated as noted above.

In some implementations, the controllers 47, 48 may cooperate with the VCSELs 36 to perform active beam steering, at Block 105. For example, this may be advantageous where there is some degree of misalignment between the VCSEL arrays 36 and corresponding photodetector arrays 37 and/or contaminants on the optical windows 33, 34 in the optical path. This allows for self-optimization after mating to help overcome such areas of contaminants. In addition to beam steering, providing redundant optical paths and electrical circuitry allows for increased reliability and robustness, as well as the ability to operate at reduced bandwidth in partial failure or obstruction conditions. Moreover, "defocusing" or blurring of the beam slightly may advantageously help to further relax alignment restrictions. Pointing and alignment between the VCSEL arrays 36 and the high-speed small area photodetectors 37 may be achieved through feedback between the transmit and receive components, as noted above.

Figure 18:
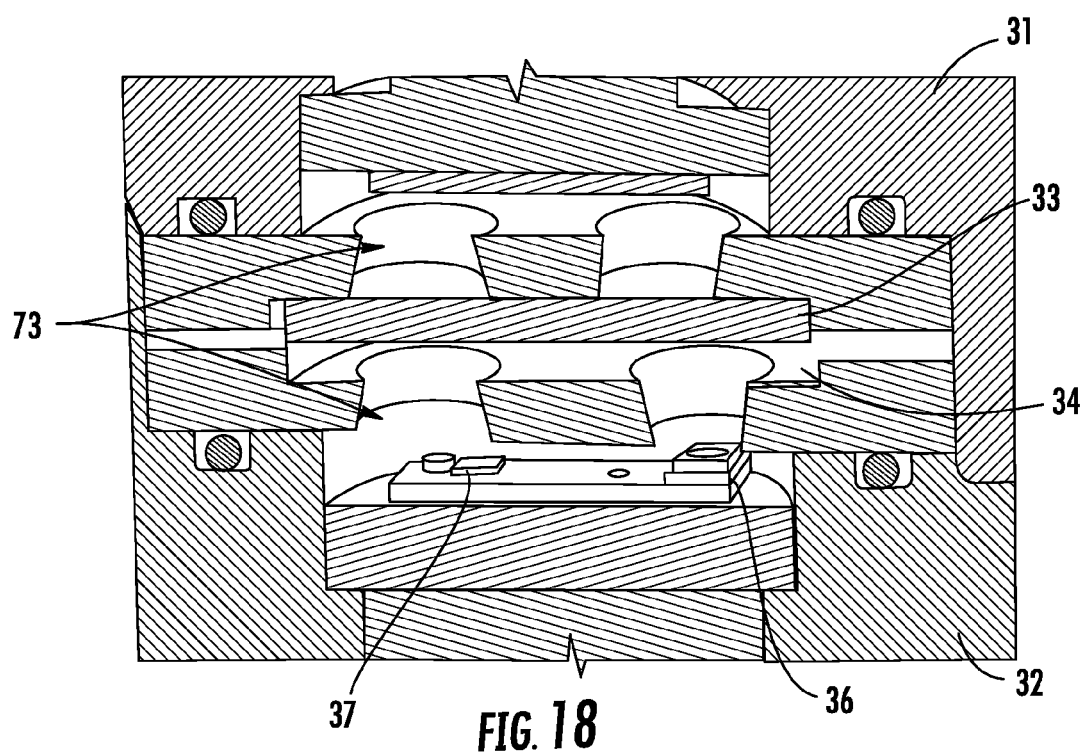
FIG. 18 is a cross-sectional view of an example embodiment of the optical connector assembly of FIG. 1 in which the first and second housings have corresponding light barrels therein defining respective light channels.

More particularly, an example configuration with redundant optical light paths is shown in FIG. 18. The above-described optical connector architecture advantageously enables implementation of multiple parallel yet independent optical channels of varied possible packaging orientations. In the illustrated example, the light channels are implemented using light barrels 73 in the first and second housings 31, 32 with tapered sidewalls (resembling a portion of a cone) which provide inherent stray light filters to improve the quality of the light (signal) with fewer ambiguities. The respective transmitter 36 and detector 37 are aligned on opposing ends of the light barrels 73, and the shape of the tapered sidewalls of the light barrels reduces the quantity of stray light that ends up on the detectors 37. That is, the wave front that reaches the detector 37 is largely coherent containing fewer light ambiguities that can degrade signal quality. Moreover, by including multiple light channels in the connector assembly 30, when certain light channels are suffering from non-coherent light as a result of misalignment, imperfections, contamination, edge effects, etc., other light channels may remain that do not have such issues. As a result, the undesirable interference patterns that would otherwise degrade the signal quality of a single detector 37 subject to non-coherent light can be avoided by using a better light channel which provides higher signal quality.

Furthermore, as noted above, the electromagnets 239, 240 may optionally be operated to create a repulsive force for decoupling or de-mating the first and second housings 31, 32 from one another, at Block 106. This concludes the method illustrated in FIG. 11 (Block 107).

Figure 12:
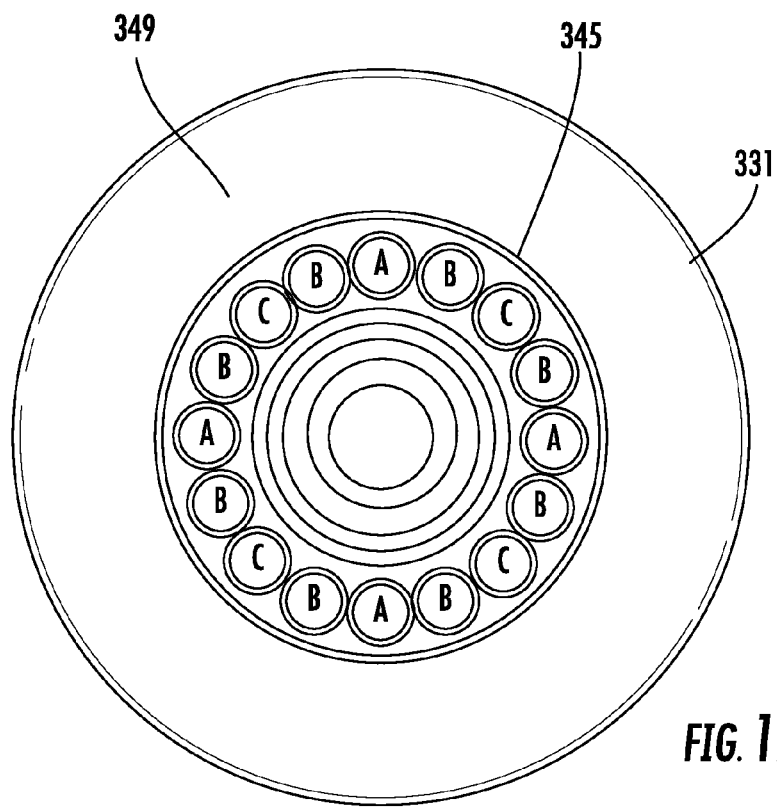
FIGS. 12 and 13 are end and side views, respectively, of another optical connector assembly including a plurality of magnets carried within self-aligning features of the connector incorporating electromagnets.
Figure 13:
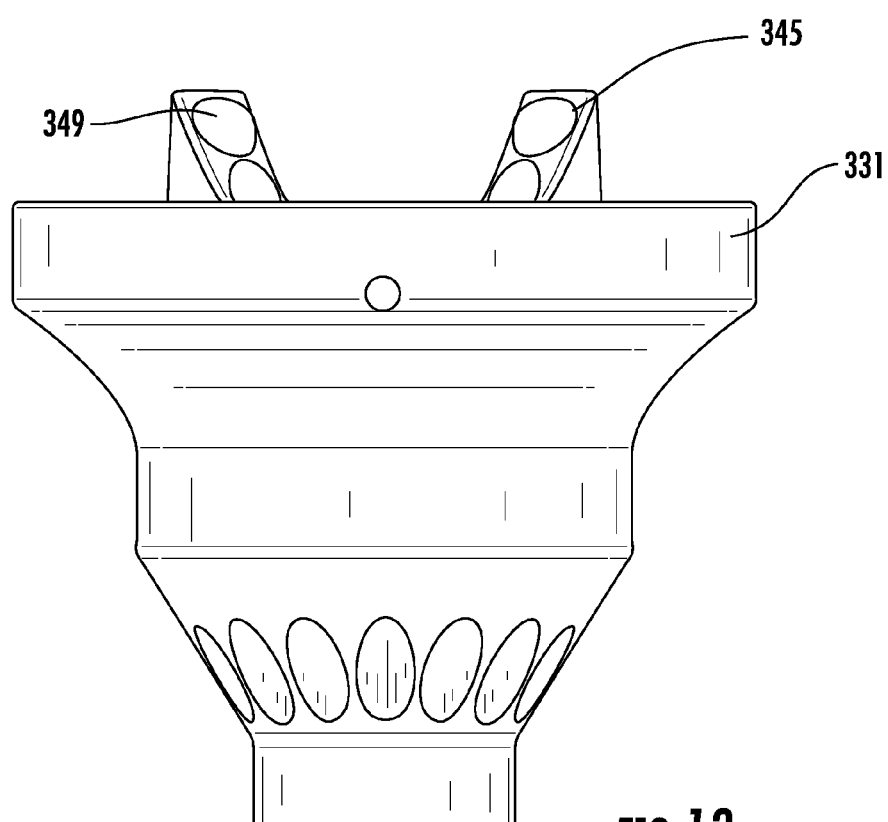

Another example housing 331 with an array of permanent magnets 349 incorporated within the self-aligning features 345 is now described with reference to FIGS. 12 and 13. A mating force study was conducted for this configuration, in which magnets of different heights (A, B, and C in FIG. 12) were used, and the results are shown in Table 1 below.

TABLE 1

| Position | Qty | Size (inches) | Tip angle | Gap (inches) | Force (lbs.) | Total force (lbs.) |
|---|---|---|---|---|---|---|
| A | 4 | .1875*.5 (.125*.5) | 0° | (.045*2) + .2 | .39 (.11) | 1.56 (.44) |
| B | 8 | .1875*.42 (.125*.42) | 40° | (.045*2) + .2 | .37 (.11) | 2.96 (.88) |
| C | 4 | .1875*.39 (.125*.39) | 50° | (.045*2) + .2 | .36 (.11) | 1.44 (.44) |
| Total force (lb) @ diameter of .1875 (.125) | | | | | | 5.96 (1.76) |

It should be noted that the foregoing is only one example use case, and that other arrangements may also be used.

Figure 14:
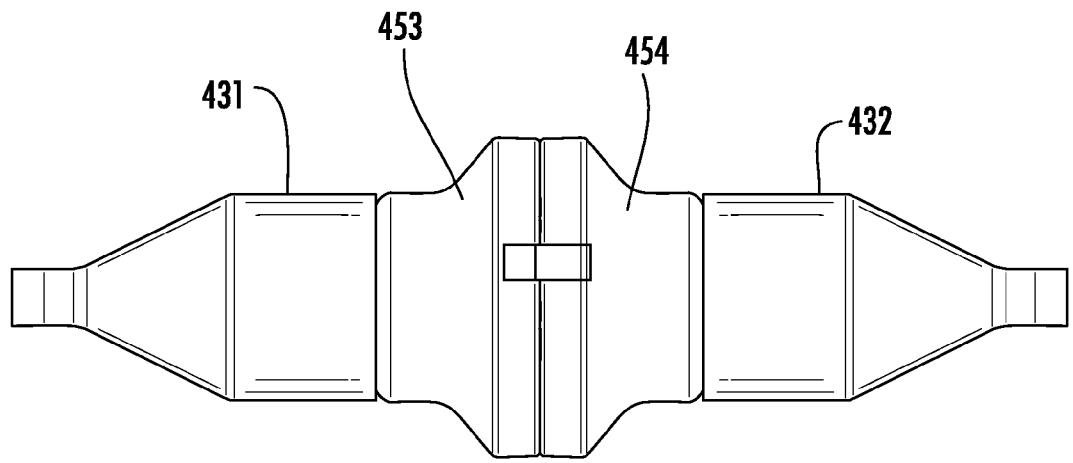
FIG. 14 is side view of the optical connector assembly of FIG. 1 further illustrating clamp features for securing the housings together.
Figure 15:
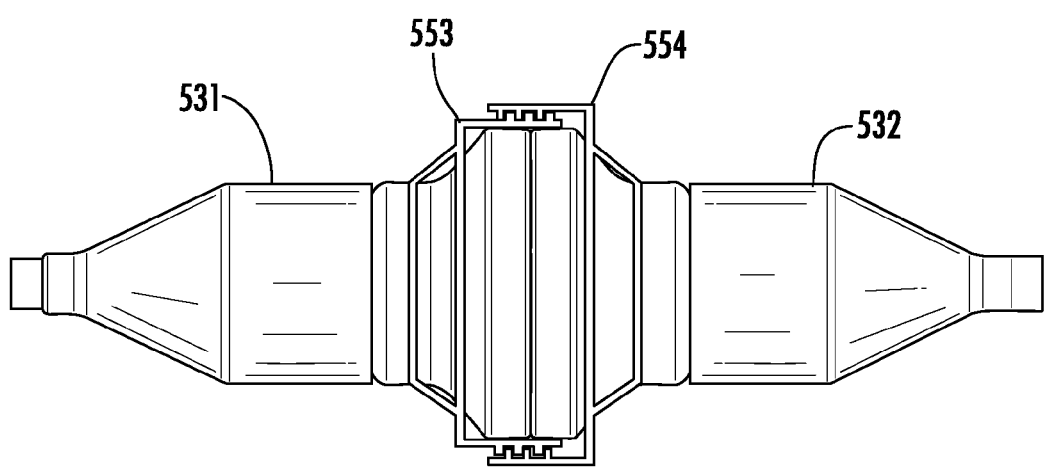
FIG. 15 is a side view similar to FIG. 17 illustrating threaded features on the optical connectors.

Turning now to FIGS. 14 and 15, in various embodiments the first and second housings 31, 32 may further include mechanical features to help secure or hold the housings together when mated. In the example of FIG. 14, first and second housings 431, 432 each includes a respective clamp feature 453, 454 configured to mechanically secure the first and second housings together when mated. In the embodiment of FIG. 15, first and second housings 531, 532 each includes a respective threaded features 553, 554. Other example options may include cam latches, thumb screws, etc. The mechanical latching mechanism may be manual or remotely engaged or disengaged, or combined integrally with the magnetic features described above.

Figure 16:
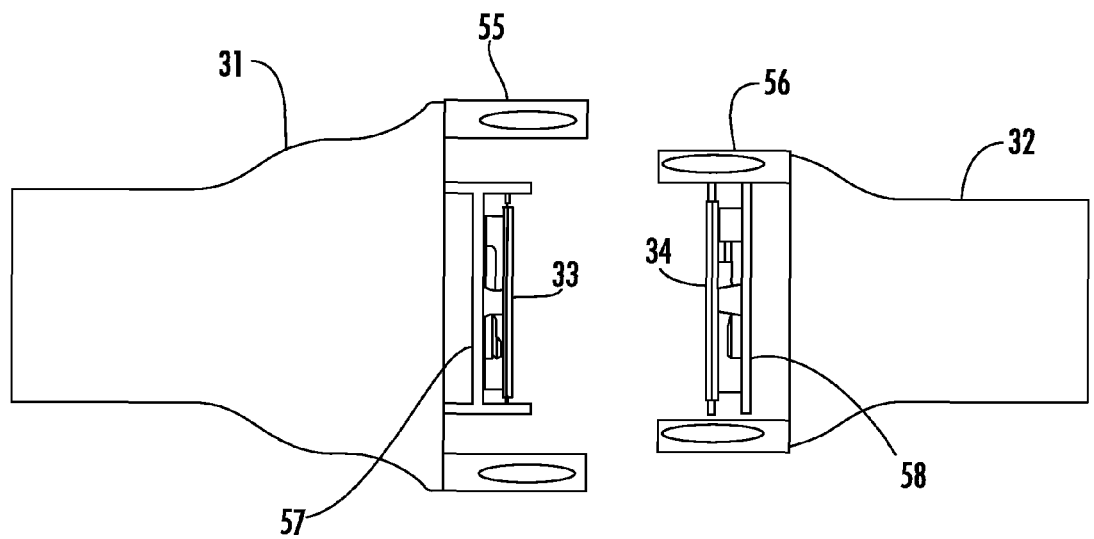
FIGS. 16 and 17 are schematic side views of example optical connectors which may be used with the assembly of FIG. 1 in un-mated and mated positions, respectively, and including inductive power windings.
Figure 17:
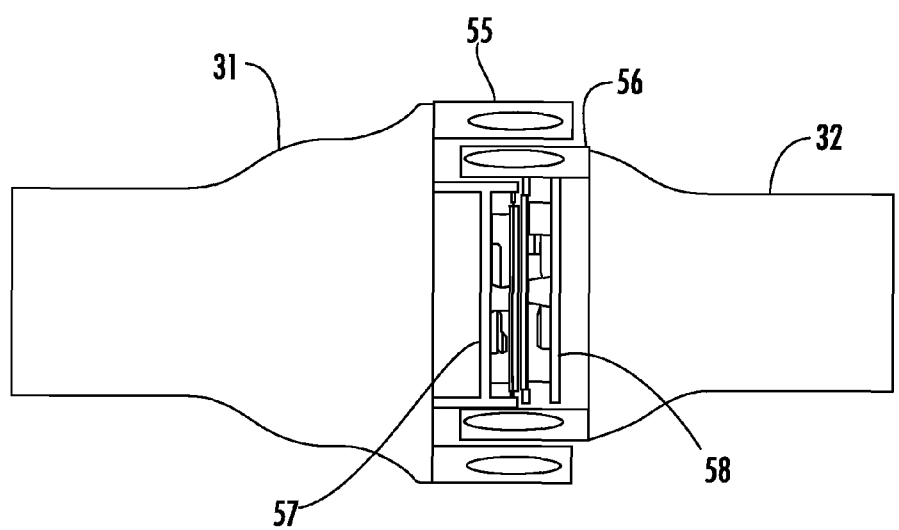

Referring now additionally to FIGS. 16 and 17, in some embodiments the first and second housings 31, 32 may optionally include respective inductive power windings 55, 56 configured to inductively transfer power therebetween. The notable advantage in power transfer may be accomplished while the two connector housings 31, 32 are completely sealed, and no direct physical contact is required. This may be advantageous where a remote device needs to receive power from a ship, etc., for example. In the illustrated example, the connectors are shown in an un-mated position in FIG. 16, and a mated position in FIG. 17. When mated, the windings 56 of the second housing 32 (here the male plug) are positioned inside the windings 55 of the first housing 31 (here the female receptacle), although other arrangements of the windings may be used. However, it should be noted that in other embodiments the inductive power windings 55, 56 may be connected in a face-to-face relationship when the first and second housings 31, 32 are mated together (i.e., the windings are not arranged one inside the other as shown in FIGS. 16-17, but instead meet end-to-end). In the illustrated examples, a respective circuit board 57, 58 is carried in the hermetically sealed cavities of each of the first and second housings 31, 32, for the associated electronic interface circuitry for the optical transmitters 35.

To recap, the optical connector assembly 30 may provide numerous advantages over conventional approaches. For example, an embedded control loop may be implemented in the communications protocol for active beam steering or beam selection to provide the optimum light path after mating. Additionally, multiple light channel options may be provided for higher bandwidth utilization (higher data rates) and redundancy. The reliability and redundancy is due in part to a "graceful degradation" of the optical light channels. As noted above, the overall architecture enables failure modes that may degrade the performance without losing all capability. By way of example, rates of 12 Gbps are possible using a single optical path, which is significantly faster than typical non-contact RF approaches. Furthermore, multiple optical paths and/or wavelengths of light may be used on the same or separate VCSEL arrays included within a single connector. The assembly 30 may further provide even high error tolerance, as well as the ability to operate in a partial failure mode at reduced bandwidths. Moreover, the assembly may accommodate simultaneous streaming of multiple photodetectors, as well as multiple sensor types.

In addition, the above-described mechanical packaging components may provide further advantages, such as the hermetically sealed receptacles, and optical glass that is set to a zero space, or near zero space interface for minimal separation of optics and better consistency of performance. The first and second housings 31, 32 may be "self-fitting", and the magnets may "self-align" and "snap together" (with no/low insertion force) to help maintain contact and provide integral holding force, essentially making the assembly "blind-mateable". Once in close proximity the first and second housings 31, 32 magnetically align within operational tolerances, which helps avoid the need for high precision alignments, high force mating requiring, skilled operators, and/or additional training and special tooling associated with conventional approaches. The optional secondary mechanical latching clamps may provide reinforcement against breakaways in turbulent, high current or harsh operating environments. Additionally, the use of electromagnets may be employed to reverse the magnetic field on one end to separate the first and second housings 31, 32 with no mechanical force, in some implementations. The assembly 30 may advantageously provide for relatively low size, weight, and power requirements, and thus relatively easy incorporation in both new and existing infrastructures.

The magnetic "wiggle" of the optical windows may help with self-cleaning and reseating of the windows, and the liquid exit ports optionally provide for flushing of water and contaminants from between the windows. In some embodiments, an optical gel or film may be added to minimize contamination and biofouling of the optical windows, if desired. In addition, sensors may be included to detect when the optical windows are mated optimally. Where less than favorable connectivity would be achieved, the magnetic "wiggle" may be initiated prior to enabling the optical communications, and/or inductive power transfer.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An optical connector assembly comprising:
a first housing having a first opening therein;
a second housing having a second opening therein;
a first optical window carried by said first housing within said first opening;
a second optical window carried by said second housing within said second opening;
at least one Vertical Cavity Surface Emitting Laser (VCSEL) carried within said first housing behind said first optical window;
at least one photodetector carried within said second housing behind said second optical window;
a first magnetic member carried by said first housing; and
a second magnetic member carried by said second housing and configured to cooperate with said first magnetic member to bias said first and second housings together so that said at least one VCSEL and said at least one photodetector are in optical alignment.

2. The optical connector assembly of claim 1 wherein at least one of said first and second magnetic members comprises at least one electromagnet.

3. The optical connector assembly of claim 2 further comprising a controller coupled to said at least one electromagnet and configured to operate said at least one electromagnet to create relative rotational movement between said first and second housings.

4. The optical connector assembly of claim 2 further comprising a controller coupled to said at least one electromagnet and configured to operate said at least one electromagnet to create an attractive force with respect to the other magnetic member for coupling said first and second housings together.

5. The optical connector assembly of claim 2 wherein said controller is further configured to operate said at least one electromagnet to create a repulsive force with respect to the other magnetic member for decoupling said first and second housings from one another.

6. The optical connector assembly of claim 1 wherein said first housing and said first optical window define a first hermetically sealed chamber for said at least one VCSEL; and wherein said second housing and said second optical window define a second hermetically sealed chamber for said at least one photodetector.

7. The optical connector assembly of claim 1 further comprising respective first and second self-aligning features carried by said first and second housings configured to align said first and second optical housings.

8. The optical connector assembly of claim 1 wherein said first and second housings each comprises a respective clamp feature configured to mechanically secure said first and second housings together.

9. The optical connector assembly of claim 1 wherein said first and second housings each has at least one respective fluid exit port for fluid evacuation when said first and second optical windows come in physical contact with one another.

10. The optical connector assembly of claim 1 wherein said first and second magnetic members each comprises a respective array of magnets positioned adjacent said first and second optical windows.

11. The optical connector assembly of claim 1 further comprising a controller coupled with said transmit laser element and configured to beam steer light output from said at least one VCSEL.

12. The optical connector assembly of claim 1 further comprising a respective inductive power winding carried by each of said first and second housings and configured to inductively transfer power therebetween.

13. The optical connector assembly of claim 1 wherein said first and second housings define at least one light barrel through which said at least one VCSEL and said at least one photodetector are optically aligned.

14. An optical connector assembly comprising:
a first housing having a first opening therein;
a second housing having a second opening therein;
a first optical window carried by said first housing within said first opening;
a second optical window carried by said second housing within said second opening;
at least one laser light transmitter carried within said first housing behind said first optical window;
at least one photodetector carried within said second housing behind said second optical window;

a first magnetic member carried by said first housing and a second magnetic member carried by said second housing and configured to cooperate with said first magnetic member to bias said first and second housings together so that said at least one laser light transmitter and said at least one photodetector are in optical alignment, at least one of said first and second magnetic members comprising at least one electromagnet; and a controller coupled to said at least one electromagnet and configured to operate said at least one electromagnet to create relative rotational movement between said first and second housings.

15. The optical connector assembly of claim 14 wherein said controller is further configured to operate said at least one electromagnet to create an attractive force with respect to the other magnetic member for coupling said first and second housings together.

16. The optical connector assembly of claim 14 wherein said controller is further configured to operate said at least one electromagnet to create a repulsive force with respect to the other magnetic member for decoupling said first and second housings from one another.

17. The optical connector assembly of claim 14 wherein said first housing and said first optical window define a first hermetically sealed chamber for said at least one laser light transmitter; and wherein said second housing and said second optical window define a second hermetically sealed chamber for said at least one photodetector.

18. The optical connector assembly of claim 14 further comprising respective first and second self-aligning features carried by said first and second housings configured to align said first and second optical housings.

19. The optical connector assembly of claim 14 wherein said first and second housings each comprises a respective clamp feature configured to mechanically secure said first and second housings together.

20. The optical connector assembly of claim 14 wherein said first and second housings each has at least one respective fluid exit port for fluid evacuation when said first and second optical windows come in physical contact with one another.

21. The optical connector assembly of claim 14 wherein said first and second magnetic members each comprises a respective array of electromagnets positioned adjacent said first and second optical windows.

22. A method comprising:

positioning first and second optical connectors adjacent one another;

the first optical connector comprising a first housing having a first opening therein, a first optical window carried by the first housing within the first opening, at least one laser light transmitter carried within the first housing behind the first optical window, and a first magnetic member carried by the first housing;

the second optical connector comprising a second housing having a second opening therein, a second optical window carried by the second housing within the second opening, at least one photodetector carried within the second housing behind the second optical window, and a second magnetic member carried by the second housing and configured to cooperate with the first magnetic member to bias the first and second housings together so that the at least one laser light transmitter and the at least one photodetector are in optical alignment, at least one of the first and second magnetic members comprising at least one electromagnet; and operating the at least one electromagnet to create relative rotational movement between the first and second housings.

23. The method of claim 22 further comprising operating the at least one electromagnet to create an attractive force with respect to the other magnetic member for coupling the first and second housings together.

24. The method of claim 22 further comprising operating the at least one electromagnet to create a repulsive force with respect to the other magnetic member for decoupling the first and second housings from one another.

* * * * *